United States Patent
DePue et al.

(10) Patent No.: US 7,091,886 B2
(45) Date of Patent: Aug. 15, 2006

(54) FLEXIBLE TOUCH-SENSE SWITCH

(75) Inventors: Todd L. DePue, Brighton, MI (US); David A. Hein, Sterling Heights, MI (US)

(73) Assignee: Lear Corporation, Southfield, MI (US)

( * ) Notice: Subject to any disclaimer, the term of this patent is extended or adjusted under 35 U.S.C. 154(b) by 304 days.

(21) Appl. No.: 10/864,128

(22) Filed: Jun. 9, 2004

(65) Prior Publication Data

US 2005/0275567 A1    Dec. 15, 2005

(51) Int. Cl.
*H03K 11/00* (2006.01)
(52) U.S. Cl. ............................. 341/33; 341/34; 341/27; 400/479.1; 200/18; 200/5 D; 200/600; 200/51.05; 310/311; 310/318
(58) Field of Classification Search ............... 341/33, 341/34, 27; 400/479.1; 200/18, 5 D, 42.01, 200/51.05, 600; 310/339, 311, 318
See application file for complete search history.

(56) References Cited

U.S. PATENT DOCUMENTS

| | | | |
|---|---|---|---|
| 4,001,798 A | 1/1977 | Robinson | 341/22 |
| 5,162,618 A | 11/1992 | Knowles | 178/18.04 |
| 5,329,070 A | 7/1994 | Knowles | 178/18.04 |
| 5,451,723 A | 9/1995 | Huang et al. | 178/18.04 |
| 5,673,041 A | 9/1997 | Chatigny et al. | 340/870.18 |
| 5,982,304 A * | 11/1999 | Selker et al. | 341/27 |
| 6,064,141 A * | 5/2000 | Wiciel | 310/339 |
| 6,104,119 A * | 8/2000 | Guzik et al. | 310/311 |
| 2002/0084721 A1 | 7/2002 | Walczak | 310/339 |

\* cited by examiner

*Primary Examiner*—Albert K. Wong
(74) *Attorney, Agent, or Firm*—MacMillan, Sobanski & Todd, LLC

(57) ABSTRACT

A flexible touch-sense switch includes a force sensitive composite and an at least one proximity sensor. The force sensitive composite includes a plurality of force sensors disposed between a first layer and a second layer of polymide film defining a displacement region. The at least one proximity sensor generates an electromagnetic field that defines a detection region. The force sensitive composite and the at least one proximity sensor are mounted to the first layer of the polymide film for forming a flexible printed circuit board. A control circuit is electrically connected to the force sensitive composite and the at least one proximity sensor for selectively controlling the touch-sense switch activation in response to coincident actuation thereof.

20 Claims, 3 Drawing Sheets

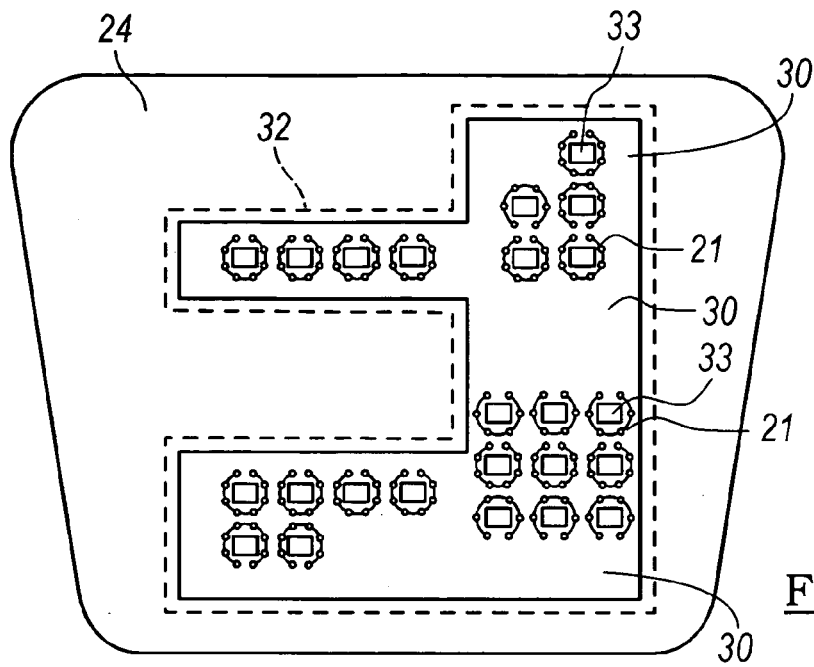
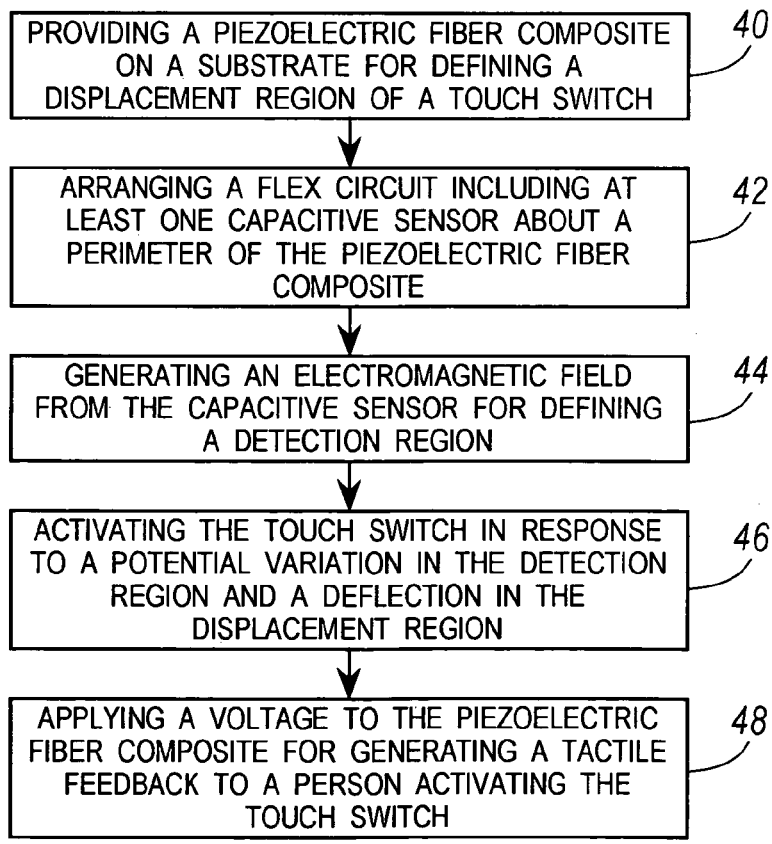
FIG. 6
FIG. 7

FLEXIBLE TOUCH-SENSE SWITCH

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

1. Field of the Invention

The present invention relates in general to a flexible touch-sense switch, and more specifically, to a redundant flexible touch-sense switch that is cooperatively activated by a deflection of a piezo-electric composite and a potential variation of an electromagnetic field.

2. Description of the Related Art

Vehicle input control devices typically require rotating a control knob, depressing a control button, or sliding a mechanical or electro-mechanical control switch to operate and activate a vehicle accessory device. Aside from typical pushbutton make and break switches, piezo-electric elements have been used for user interfaces such as keyboards, touch pads, switches, and the like. Piezoelectric elements exhibit a dielectric change when a mechanical distortion (pressure, stretch, or compression) is exerted on the piezoelectric element. The piezoelectric element may generate electrical charges when mechanically distorted. The distortion is typically the result from direct pressure or vibration exerted on the piezoelectric element. However, a drawback with using the piezoelectric element for vehicle switch actuation is that vibrations from the vehicle or road surfaces (e.g., bumps) may result in an unintended switch actuation.

Capacitive sensors have also been used for switch actuation. A capacitive sensor disposed under a surface fascia creates an electric field above the surface fascia. If an object is displaced within the electric field, a change of capacitance may be sensed to indicate a request by an operator to actuate a switch. Because the capacitive sensors are typically mounted under the surface of the fascia unit, activation of a switch may occur when an object is inadvertently placed on or in close proximity to the sensor. This ultimately can lead to activation of a device that was not intended. Furthermore, if the capacitive sensors are placed in close proximity to one another, overlapping electrical fields may occur which may also lead to activation of a switch adjacent to the switch intended for activation.

SUMMARY OF THE INVENTION

The present invention has the advantage of integrating a force sensitive based material with at least one proximity sensor for cooperatively activating a vehicle accessory via a touch-sense switch, resulting in an inexpensive switch which is unlikely to be activated in error.

A flexible touch-sense switch includes a force sensitive composite and an at least one proximity sensor. The force sensitive composite includes a plurality of force sensors disposed between a first layer and a second layer of polyamide film defining a displacement region. The at least one proximity sensor generates an electromagnetic field that defines a detection region. The force sensitive composite and the at least one proximity sensor are mounted to the first layer of the polyamide film for forming a flexible printed circuit board. A control circuit is electrically connected to the force sensitive composite and the at least one proximity sensor for selectively controlling the touch-sense switch activation in response to coincident actuation thereof.

BRIEF DESCRIPTION OF THE DRAWINGS

FIG. 6 is a rear perspective view of an instrument control panel according to a second preferred embodiment of the present invention.

FIG. 7 is a flowchart of a preferred method for activating a flexible touch-sense switch.

DETAILED DESCRIPTION OF PREFERRED EMBODIMENTS

Figure 1:
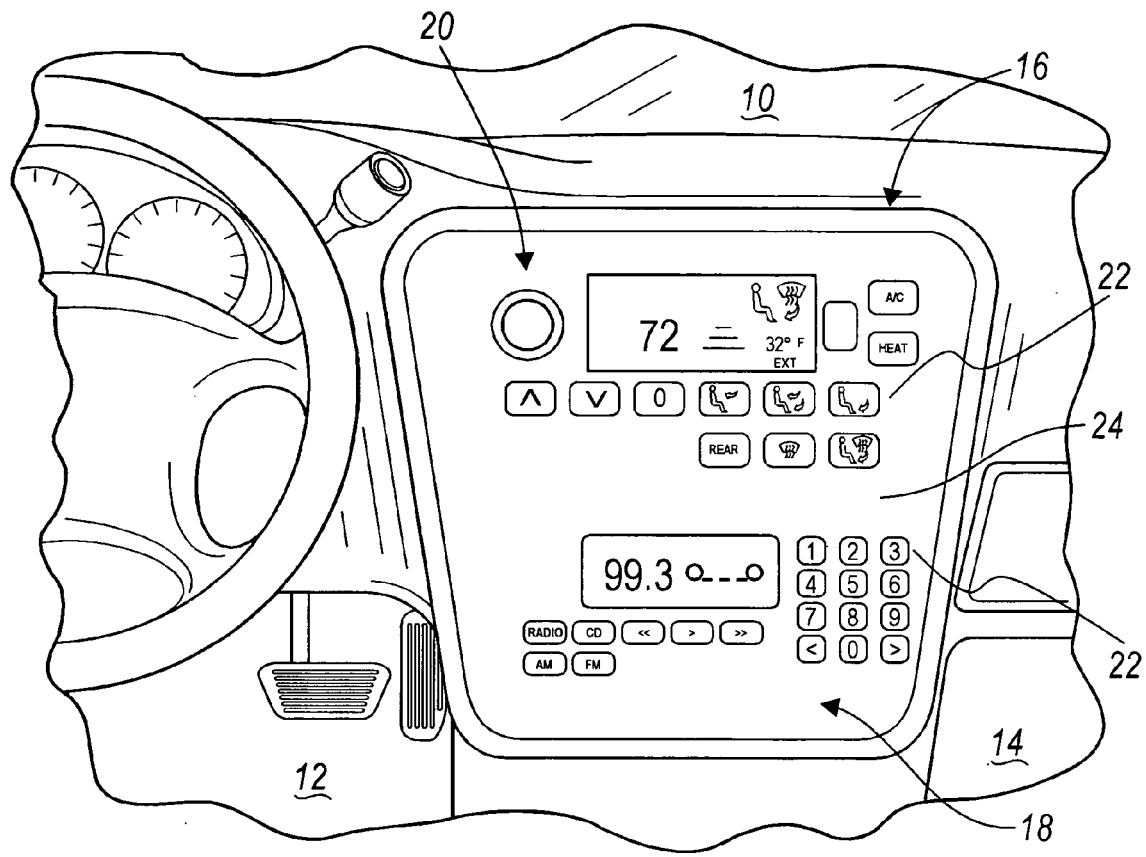
FIG. 1 is a perspective view of an instrument control panel for controlling vehicle accessories.

Referring now to the Drawings and particularly to FIG. 1, there is shown an interior passenger compartment 10 of a vehicle according to the present invention. The interior passenger compartment 10 comprises a front driver's seating area 12, a front passenger seating area 14, and a center accessory control unit 16. The center accessory control unit 16 includes a multimedia control unit 18 and a climate control unit 20. Both control units include a plurality of switches 22 for controlling a specific feature of each respective accessory. For example, the multimedia control unit 18 typically includes switches for controlling multimedia selections such as CD, radio, AM/FM, fast forward, reverse, and preset memory. The climate control unit 20 typically include switches for controlling temperature increase/decrease, defrost, A/C, blower motor, and blower motor output porting.

The plurality of switches 22 is disposed under a surface of a substrate 24 (i.e., bezel). The sensing elements of each switch face toward the interior of the vehicle for sensing and determining the presence of an object (e.g., finger) for actuating a respective switch. The plurality of switches 22 each includes a piezoelectric fiber composite (shown in FIG. 2) and at least one proximity sensor (shown in FIG. 2). The substrate 24 may further comprise graphical elements or other indicators printed on an exterior surface of the substrate 24 over the respective region of each respective switch to identify the location of each respective switch and its associated function. In addition, lighting schemes may be added to illuminate the respective switch or graphic display. Lighting sources such as LED, light piping, or electroluminescent (EL) lighting may be used to illuminate an illumination region of each respective switch.

Figure 2:
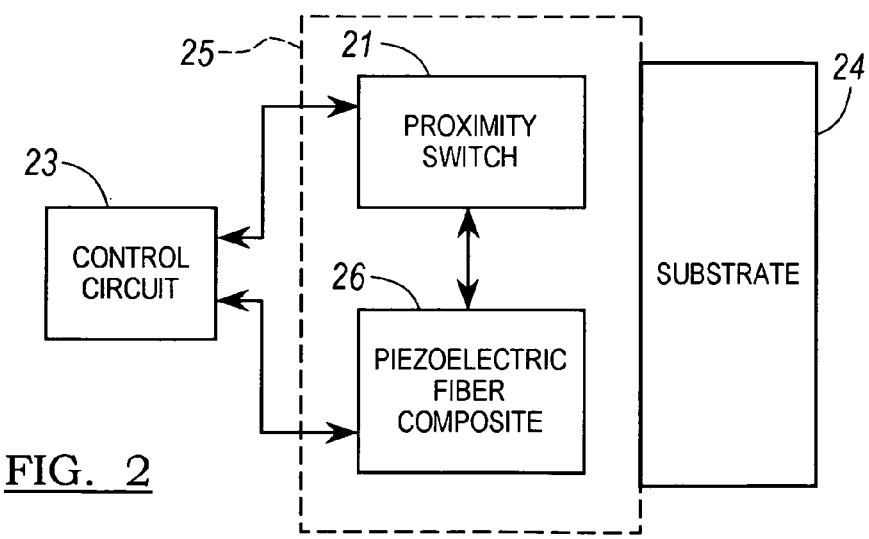
FIG. 2 is a block diagram of a user control system according to a preferred embodiment of the present invention.

FIG. 2 illustrates a block diagram of a schematic for a touch-sense switch according to a preferred embodiment of the present invention. A touch-sense switch 25 includes at least one proximity sensor 21 and the piezoelectric fiber composite 26 (i.e., force sensitive composite). Preferably, a capacitive sensor is used, however, in alternative embodiments, other types of proximity sensors may be used such as a field effect sensor. The at least one proximity sensor 21 generates an electric field in a detection region above the surface of the substrate 24 when energized by an AC voltage signal. In a multi-switch unit, each touch-sensor switch has an associated detection region defined by one or more proximity sensors. An object (e.g., a finger) selectively displaced within a respective detection region changes the electric field. The sensed change in the electric field is associated with a request to actuate a corresponding accessory function. The piezoelectric fiber composite 26, which is discussed in detail infra, simultaneously senses for a pressure or vibrational force for determining a request for switch activation.

The touch-sense switch 25 is mounted to a rear surface of the substrate 24. In the preferred embodiment, adhesive is used to mount the touch-sense switch 25 to the substrate, however in alternative embodiments, other mounting methods may be used. The control circuit 23 is electrically connected to the at least one proximity sensor 21 and the piezoelectric fiber composite 26 for determining touch-sense switch activation in response to sensed signals received from the piezoelectric fiber composite 26 and the at least one proximity sensor 21. The activation of the touch-sense switch 25 is in coincidence to both the piezoelectric fiber composite 26 and the at least one proximity sensor 21. That is, the activation of the piezoelectric fiber composite 26 and the at least one proximity sensor 21 may preferably be substantially simultaneous but may also be activated consecutively of one another as opposed to simultaneously. For example, the at least one proximity sensor 21 may sense the presence of the object prior to the object touching the piezoelectric fiber composite 26. The control circuit 23 will wait for the activation of the piezoelectric fiber composite 26 and the at least one proximity sensor 21 within a predetermined period of time of one another before activating the touch-sense switch 25. The control circuit 23 may, thereafter, supply an output signal to the piezoelectric fiber composite 26 for generating a tactile feedback or audible feedback in response to activation signals sensed from the piezoelectric fiber composite and the at least one proximity sensor 21.

Figure 3:
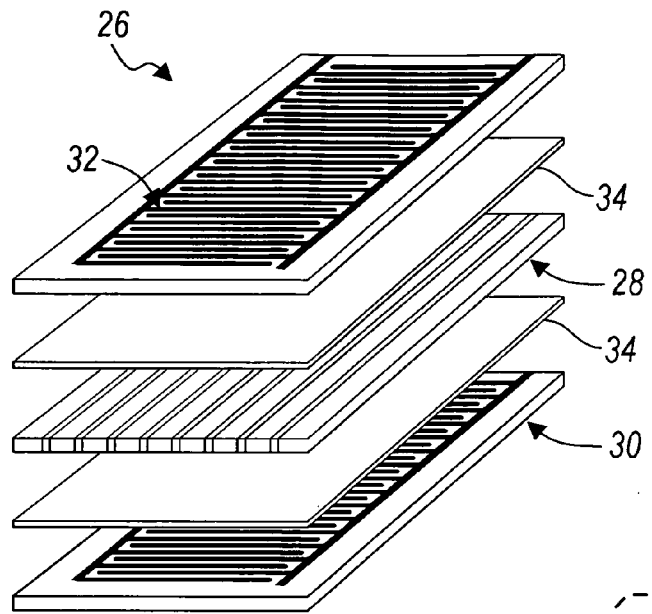
FIG. 3 is an exploded, perspective view of a piezoelectric fiber composite according to a preferred embodiment of the present invention.

FIG. 3 illustrates the piezoelectric fiber composite 26 used for sensing an object exerting a force on a respective switch according to a preferred embodiment. The piezoelectric fiber composite 26 is a macro fiber composite (MFC) produced by Smart Material Corporation, for example. The piezoelectric fiber composite 26 includes a sheet of aligned rectangular piezo-ceramic fibers 28 that functions as a force sensor. The piezo-fibers 28 are disposed between a first polymide layer 30 and a second polymide layer 32. The first polymide layer 30 and the second polymide layer 32 are interdigitated patterned flexible plastic insulation films that integrate electrodes for transferring voltage to and from the piezo-fibers 28. Alternatively, the electrodes may be a separate layer mounted on the polyamide layers. The piezoelectric fiber composite 26, is a composite that when stretched or compressed, exhibits a change in a dielectric constant. This change in dielectric constant produces a voltage output. A small current may be produced as well. Alternatively, when the piezoelectric fiber composite 26 is subjected to an electrical field, the structure of the piezoelectric material may change dimensionally in structure. The piezo-fibers 28 in cooperation with the interdigitated patterned electrodes enables in-plane poling, actuation, and sensing. In the preferred embodiment, an adhesive such as a structural epoxy is used to adhere the first polymide layer 30 and the second polymide layer 32 to the piezo-fibers 28. In other alternative embodiments, other methods of attachment may be used.

Pressure or vibration exerted on the piezoelectric fiber composite 26 will result in a deflection or distortion thereby generating a voltage which is indicative of a request by a person depressing the touch-sense switch 25 to actuate a vehicle accessory function via a respective switch. In response to the person activating the switch, an acknowledgment of the switch activation may be provided in the form of a tactile feedback and/or audible feedback by applying a voltage to the piezoelectric fiber composite 31 so as to deflect piezoelectric fiber composite 26. This deflection will occur and be exerted on the finger of the person actuating the respective switch.

As stated supra, piezoelectric material is structurally displaced by a pressure or vibration, and as a result, unintended switch actuation may occur from vehicle vibration or rough road surfaces. To verify that switch activation is intended and not the result of an unintentional external vibrational force, a determination is made whether a potential variation occurs in the electromagnetic field generated by the proximity sensor. The control circuit 23 is electrically connected to the proximity sensor 21 and the piezoelectric fiber composite 31 for receiving signal inputs and for selectively controlling the activation of the touch-sense switch 25. For touch-sense switch activation to occur, a deflection is detected within the displacement region of the piezoelectric fiber composite 31 and a potential variation is simultaneously or consecutively detected within the detection region of the proximity sensor 21.

Figure 4:
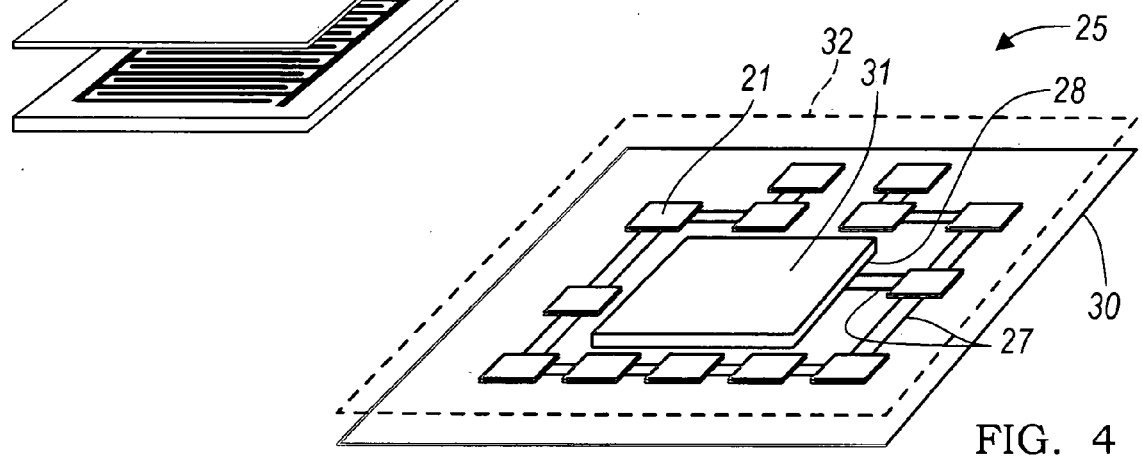
FIG. 4 is a perspective view of a flexible printed circuit board according to a preferred embodiment of the present invention.

FIG. 4 is a perspective view the touch-sense switch 25. The piezo-fibers 26 are disposed between the first polymide layer 30 and the second polymide layer 32 (i.e., assuming a respective electrode is integrated within each polyamide layer). A plurality of proximity sensors may be positioned along the perimeter and in close proximity to the piezo-fiber 28 so that any object producing a force on the second polymide layer 32 may be sensed by the plurality of proximity sensors. In the preferred embodiment, the piezo-fibers 28 extend over each polyamide surface between the first and second polyamide layer 30 and 32. The proximity sensors 21 are disposed over a top surface of the second polymide layer 32. A flex circuit 27 may be used to route sensed signals between the at least one proximity sensor 21 and the control circuit 23. Furthermore, the flex circuit 27 may further facilitate the routing of piezoelectric sensed signals from the piezoelectric fiber composite 26 to the control circuit 23. All layers and components are pliable such that touch-sense switch 25 can conform to non-planer surfaces. This eliminates restrictions of packaging switches in locations which are on or near curved surfaces. The thin profile of the invention also allows switches to be mounted in areas where packaging space is simultaneously insufficient to mount conventional switches and their associated electronic modules.

Figure 5:
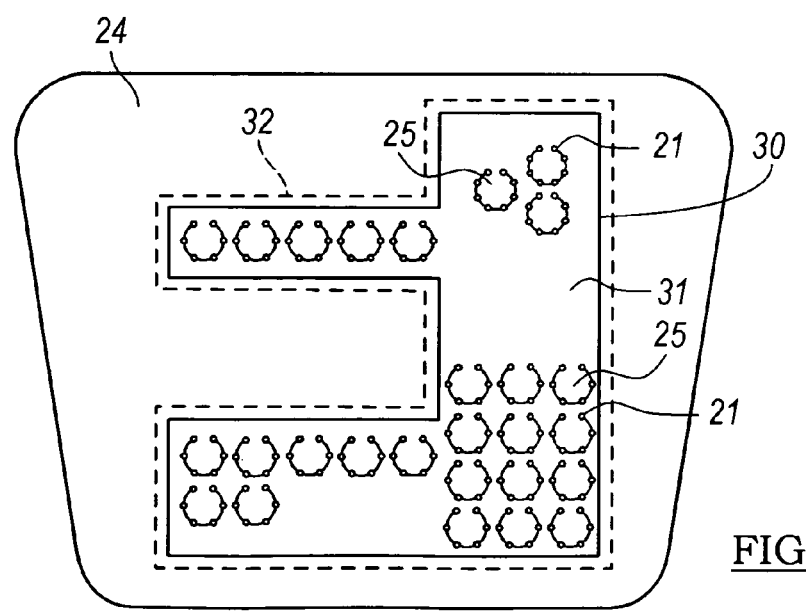
FIG. 5 is a rear perspective view of an instrument control panel according to a preferred embodiment of the present invention.

FIG. 5 illustrates a rear view of a substrate 24 (i.e., underside bezel surface) including a plurality of touch-sense switches mounted on a first side surface of the substrate 24. The first polyamide layer 30 and the second polyamide layer 32 are flexible plastic insulation layers that are common to all touch-sense switches. A plurality of piezo-fibers are mounted to the respective surfaces between the first and second polyamide layer 30 and 32. The layer of piezo-fibers 28 extends over each surface between the first and second polyamide layer 30 and 32 such that a uniform continuous piezoelectric fiber composite is formed.

The plurality of proximity sensors are mounted either under or over a surface of the piezoelectric fiber composite 26. Each of the proximity sensors 21 are aligned with the graphical element printed on the exterior surface of the substrate 24. When activating a respective touch-sense switch, a force exerted upon any displacement region on the piezoelectric fiber composite 26 will satisfy a first condition for actuating the touch-sense switch. When a respective proximity sensor coincidentally senses the object within the detection region, a second condition is satisfied such that the touch-sense switch 25 is actuated and the respective accessory associated with the touch-sense switch 25 is activated. As a result, by cooperatively requiring a deflection to occur in a displacement region of the piezoelectric fiber composite 26 and a potential variation to occur in the detection region, an inadvertent actuation of a respective switch by an object incidentally being displaced in close proximity to a respective proximity sensor (i.e., as the sole requirement for actuation) is eliminated.

FIG. 6 illustrates another embodiment of a rear view of the substrate including the plurality of touch-sense switches mounted on a first side surface of the substrate 24. In this embodiment, the first polymide layer 30 and the second polyamide layer 32 are flexible plastic insulation layers common to all touch-sense switches. A plurality of piezo-fiber composites 33 are mounted between the first polymide layer 30 and a second polyamide layers 32 thereby creating a respective displacement region for each touch-sense switch. Each of the plurality of piezo-electric fiber composites 33 are mounted to the underside of the substrate 24 at each respective touch-sense switch location as identified by the graphic element printed on opposite side of the substrate 24.

The plurality of proximity sensors is formed around the perimeter of each piezoelectric fiber composite, or alternatively, overlaying or underlying each piezoelectric fiber composite. With this configuration, the touch-sensed switches 25 can be close in proximity with one another. When activating a respective touch-sense switch, in the event an adjacent proximity sensor senses an object, the touch-sense switch 25 or accessory associated with the respective adjacent touch-sense switch will not be activated unless the deflection occurs in the displacement region of the respective adjacent touch-sense switch. As a result, the plurality of touch-sense switches may be packaged in close proximity to one another eliminating the chances of inadvertently activating a touch-sense switch other than the desired touch-sense switch.

FIG. 7 is a flowchart for a method for activating a flexible touch-sense switch. In step 40, a piezoelectric fiber composite is provided for defining a displacement region within a substrate. The displacement region of the substrate may be a non-planar surface. The piezoelectric fiber composite is attached to the first surface of the substrate while the graphical display is printed on the second surface of the substrate for identifying the location of the displacement region. In step 42, the touch-sensor switch includes at least one proximity sensor disposed about a perimeter of the piezoelectric fiber composite. Alternatively, the proximity sensor may be disposed on top or underneath the piezoelectric fiber composite. In step 44, an AC voltage is applied to the proximity sensor for generating an electromagnetic field. The electromagnetic field defines a detection region about the substrate. In step 46, the touch-sense switch is selectively activated by the control circuit in response to a potential variation in the detection region and a deflection in the displacement region. In step, 48 a voltage is applied to the piezoelectric fiber composite. The voltage applied to the piezoelectric fiber composite produces a deflection in the structure of the piezoelectric fiber composite. The deflection provides a tactile feedback to a person actuating the touch-sense switch to confirm that the touch-sense switch is being activated. Alternatively, an audible feedback may be used as opposed to the tactile feedback or the tactile and audible feedback may be used in combination.

From the foregoing description, one ordinarily skilled in the art can easily ascertain the essential characteristics of this invention and, without departing from the spirit and scope thereof, can make various changes and modifications to the invention to adapt it to various usages and conditions. For example, other types of displacement materials may be used in place of the piezoelectric fiber composite without departing from the spirit and scope thereof.

What is claimed is:

1. A flexible touch-sense switch comprising:
   a force sensitive composite including at least one force sensor disposed between a first layer and a second layer of polymide film defining a displacement region;
   an at least one proximity sensor for generating an electromagnetic field defining a detection region; and
   a control circuit electrically connected to said force sensitive composite and said at least one proximity sensor for selectively controlling touch-sense switch activation in response to coincident actuation thereof;
   wherein said force sensitive composite and said at least one proximity sensor are mounted to said first layer of said polymide film for forming a flexible printed circuit board.

2. The flexible touch-sense switch of claim 1 wherein said at least one proximity sensor and said force sensitive composite cooperatively activate said touch-sense switch in response to a potential variation of said detection region and a deflection in said displacement region.

3. The flexible touch-sense switch of claim 1 wherein said force sensitive composite includes a fiber composite and said at least one force sensor includes a plurality of piezo-fibers.

4. The flexible touch-sense switch of claim 1 wherein a flex circuit electrically connects said force sensitive composite and said at least one proximity sensor to said control circuit for transmitting signals.

5. The flexible touch-sense switch of claim 1 wherein said control circuit outputs a voltage signal to said force sensitive composite for generating a tactile feedback in response to said deflection and said potential variation.

6. The flexible touch-sense switch of claim 1 wherein said control circuit outputs a voltage signal to said force sensitive composite for generating an audible feedback in response to said deflection and said potential variation.

7. The flexible touch-sense switch of claim 1 wherein said control circuit outputs a voltage signal to said force sensitive composite for generating a tactile feedback and an audible feedback in response to said deflection and said potential variation.

8. The flexible touch-sense switch of claim 1 further comprising a substrate including a first surface and a second surface, said first layer of polymide film is disposed on said first surface of said substrate.

9. The flexible touch-sense switch of claim 8 further comprising graphical elements printed on said second surface of said substrate.

10. A control panel including a plurality of flexible touch-sense switches comprising:
- an at least one force sensitive composite including a plurality of force sensors disposed between a first layer and a second layer of polymide film forming a plurality of displacement regions;
- a plurality proximity sensors for generating a plurality of electromagnetic fields define respective detection regions;
- wherein said at least one force sensitive composite and said plurality of proximity sensors are disposed on said first layer of said polymide film for forming said plurality of flexible touch-sense switches; and
- wherein a respective portion of proximity sensors and an associated force sensitive composite cooperatively activate a respective flexible touch-sense switch in response to a potential variation of said respective detection region coincident with a deflection of a respective displacement region.

11. The control panel of claim 10 wherein a control circuit outputs a voltage signal to said associated force sensitive composite for generating a tactile feedback in response to said deflection and said potential variation.

12. The control panel of claim 10 wherein said at least one force sensitive composite includes at least one fiber composite and said plurality of force sensors includes a plurality of piezo-fibers.

13. The control panel of claim 10 wherein said control circuit outputs a voltage signal to said at least one force sensitive composite for generating an audible feedback in response to said deflection and said potential variation.

14. The control panel of claim 10 wherein said control circuit outputs a voltage signal to said at least one force sensitive composite for generating a tactile feedback and an audible feedback in response to said deflection and said potential variation.

15. The control panel of claim 10 further comprising a substrate including a first surface and a second surface, said first layer of polymide film is disposed on said first surface of said substrate.

16. The flexible touch-sense switch of claim 15 further comprising graphical elements printed on said second surface of said substrate.

17. A method for activating a flexible touch-sense switch, the method comprising the steps of:
- providing a force sensitive composite for defining a displacement region, said force sensitive composite including a plurality of force sensors disposed between a first layer and a second layer of polymide film;
- arranging at least one proximity sensor on said first layer of polymide film, said at least one proximity sensor generates an electromagnetic field defining a detection region; and
- activating said touch-sense switch in response to a potential variation in said detection region coincident with a deflection of said displacement region.

18. The method of claim 17 further comprising the step of providing an output signal to said force sensitive composite for generating a tactile feedback in response to said deflection and said potential variation.

19. The method of claim 17 wherein said first polymide layer is mounted to a first surface of a substrate.

20. The method of claim 17 further comprising the step of creating graphical elements on a second surface of said substrate.

* * * * *